(12) United States Patent
Wang et al.

(10) Patent No.: US 10,928,704 B2
(45) Date of Patent: Feb. 23, 2021

(54) SHUTTER DEVICE

(71) Applicant: SHANGHAI MICRO ELECTRONICS EQUIPMENT (GROUP) CO., LTD., Shanghai (CN)

(72) Inventors: Yanfei Wang, Shanghai (CN); Fuping Zhang, Shanghai (CN); Xiang Jia, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 0 days.

(21) Appl. No.: 16/499,761

(22) PCT Filed: Aug. 9, 2017

(86) PCT No.: PCT/CN2017/096611
§ 371 (c)(1),
(2) Date: Sep. 30, 2019

(87) PCT Pub. No.: WO2018/176719
PCT Pub. Date: Oct. 4, 2018

(65) Prior Publication Data
US 2020/0103727 A1 Apr. 2, 2020

(30) Foreign Application Priority Data

Mar. 31, 2017 (CN) .............................. 201710210543

(51) Int. Cl.
*G03B 9/58* (2006.01)
*G03B 9/14* (2006.01)

(52) U.S. Cl.
CPC ....... *G03B 9/58* (2013.01); *G03B 9/14* (2013.01)

(58) Field of Classification Search
CPC .............. G03B 9/06; G03B 9/14; G03B 9/58
See application file for complete search history.

(56) References Cited

U.S. PATENT DOCUMENTS

| 6,188,193 B1 | 2/2001 | Michelson |
| 6,850,281 B2 | 2/2005 | Takahashi |
| 2007/0110433 A1* | 5/2007 | Masahiko .............. G03B 17/02 396/469 |

FOREIGN PATENT DOCUMENTS

| CN | 1087181 A | 5/1994 |
| CN | 2718641 Y | 8/2005 |

(Continued)

*Primary Examiner* — Minh Q Phan
(74) *Attorney, Agent, or Firm* — Muncy, Geissler, Olds & Lowe, P.C.

(57) ABSTRACT

A shutter device includes a movable shading module and a movement control module configured to control movement of the movable shading module. The movable shading module includes a shading unit, a driving unit and a signal measuring unit. The shading unit includes two blades, and the movement control module is configured to generate a control signal. The driving unit is configured to receive the control signal and drive the two blades. The signal measuring unit is configured to measure an operating status of the blades feed it back to the movement control module in real time. The movement control module is configured to update the control signal based on the fed back operating status. This shutter device can overcome the problems of low exposure dose accuracy and light leaks arising from the use of existing shutters and provide various accurately-controlled exposure doses suitable for different applications.

9 Claims, 5 Drawing Sheets

(56) References Cited

FOREIGN PATENT DOCUMENTS

| | | |
|---|---|---|
| CN | 101506731 A | 8/2009 |
| CN | 102087476 A | 6/2011 |
| CN | 102650799 A | 8/2012 |
| CN | 102661725 A | 9/2012 |
| CN | 102819165 A | 12/2012 |
| CN | 102918458 A | 2/2013 |
| CN | 102486594 B | 10/2014 |
| CN | 104937485 A | 9/2015 |
| EP | 2479609 A1 | 7/2012 |
| GB | 2151372 A | 7/1985 |
| JP | H09105979 A | 4/1997 |
| JP | H-11111612 A | 4/1999 |
| JP | H-11219893 A | 8/1999 |
| JP | H-11233423 A | 8/1999 |
| JP | 2001350173 A | 12/2001 |
| JP | 2002359173 A | 12/2002 |
| JP | 2005106970 A | 4/2005 |
| JP | 2008182873 A | 8/2008 |
| JP | 2010107831 A | 5/2010 |
| TW | 201214019 A | 4/2012 |

\* cited by examiner

SHUTTER DEVICE

TECHNICAL FIELD

The present disclosure relates to the technical field of fabrication of semiconductor devices and, more specifically, to a shutter device.

BACKGROUND

For exposure systems used for photolithography, exposure dose accuracy is an extremely important index generally required to below 1% and depends on the opening/closing performance of the shutter blades used. In applications employing a high power mercury lamp as a light source, the shutter blades are required to carry out an opening and closing cycle in tens of or even no more than twenty milliseconds. Since such shutters are opened and closed fast under harsh conditions with high temperatures, their blades are required to have high performance and reliability.

At present, such exposure systems typically employ either rotary shutters driven by rotary motors or reciprocating shutters driven by voice coil motors. However, these conventional rotary shutters cannot address low-dose exposure applications due to limited operating speeds, and the existing reciprocating shutters adopt open-loop control mechanisms, which are unreliable and sensitive to temperature changes, leading to unstable dose accuracy control with frequent light leaks.

The present disclosure proposes a shutter device capable of effectively addressing a variety of applications requiring different exposure doses and overcoming the problems of low exposure dose accuracy and light leaks.

SUMMARY OF THE DISCLOSURE

It is an objective of the present disclosure to provide a shutter device capable of overcoming the problems of low exposure dose accuracy and light leaks arising from the use of existing shutters and providing various accurately-controlled exposure doses suitable for different applications.

A shutter device, comprising a movable shading module and a movement control module; wherein the movement control module is configured to control a movement of the movable shading module, the movable shading module comprises a shading unit, a driving unit and a signal measuring unit, the shading unit comprises two blades, the movement control module is configured to generate a control signal, the driving unit is configured to receive the control signal and drive the two blades, the signal measuring unit is configured to measure an operating status of the two blades and feed the operating status back to the movement control module in real time, the movement control module is configured to update the control signal based on the fed back operating status.

Optionally, the shutter device comprises two driving units and two signal measuring units respectively corresponding to the two blades.

Optionally, each of the driving units comprises a motor configured to drive a corresponding one of the two blades to move, so as to allow opening and closing of the two blades.

Optionally, the movable shading module further comprises two shaft assembly units each comprising a bearing base, a rotating shaft and a bearing, the bearing disposed within the bearing base, the rotating shaft penetrating through the bearing, a corresponding one of the two blades being connected to the rotating shaft and located on a side of the rotating shaft, a corresponding one of the two driving units being connected to the rotating shaft and located on the other side of the rotating shaft.

Optionally, the shading unit further comprises two blade adapter plates, a corresponding one of the two blades being connected to the rotating shaft by a corresponding one of the two blade adapter plates.

Optionally, a thermal isolation plate is arranged between a corresponding one of the two blade adapter plates and the rotating shaft.

Optionally, the movement control module is configured to control a rotation angle error α of each of the two blades so as to ensure absence of light leaks when the two blades are closed together, according to:

$$\alpha \le \arctan\left(\frac{M - M_{min}}{2R}\right)$$

where M represents an overlap between the two blades; $M_{min}$ represents a minimum allowable overlap for the two blades; and R represents a radius of rotation of each of the two blades.

Optionally, each of the signal measuring units comprises a position sensor configured to sense a position of a corresponding one of the two blades in real time.

Optionally, the position sensor comprises a rotary encoder or a circular grating scale which is fastened at an end of the rotating shaft and configured to detect a rotation angle of the corresponding one of the two blades in real time.

Optionally, the position sensor comprises a linear grating scale.

Optionally, the movement control module comprises a processor, a trigger and a controller; wherein the processor is configured to transmit an exposure command to the trigger, the trigger is configured to trigger the controller according to the exposure command, the processor is configured to communicate with the controller through a communication interface, and the controller is configured to control the movement of the movable shading module based on information communicated from the processor.

According to the present disclosure, the shutter device comprises the movable shading module and the movement control module configured to control the movement of the movable shading module. The movable shading module comprises the shading unit, driving unit and signal measuring unit. The shading unit comprises the two blades, and the movement control module is configured to generate a control signal. The driving unit is configured to receive the control signal and drive the two blades, and the signal measuring unit is configured to measure an operating status of the blades and feed it back to the movement control module in real time. The movement control module is configured to update the control signal based on the fed back operating status. As a result, the shutter device can overcome the problems of low exposure dose accuracy and light leaks arising from the use of existing shutters and provide various accurately-controlled exposure doses suitable for different applications.

Moreover, the controller controls the motor so that the operating status of the blades can also be controlled, the position sensor feeds back the operating status of the blades to the controller in real time, the controller then adjusts the driving force of the motor, thereby forming a closed loop control, which effectively eliminates light leaks during closure of the shutter.

In these figures, 1 denotes a movable shading module; 2 denotes a movement control module; 10 denotes a shaft assembly unit; 20 denotes a signal measuring unit; 30 denotes a shading unit; 40 denotes a driving unit; 60 denotes a trigger; 70 denotes a processor; 80 denotes a controller; 101 denotes a bearing; 102 denotes a rotating shaft; 103 denotes a thermal isolation plate; 104 denotes a bearing base; 201 denotes a position sensor; 301 denotes a blade adapter plate; 302 denotes a blade; 401 denotes a magnet; and 402 denotes a coil.

DETAILED DESCRIPTION

Specific embodiments of the shutter device proposed in the present disclosure will be described in greater detail below with reference to the accompanying drawings. Features and advantages of the disclosure will become more apparent from the following detailed description and from the appended claims. Note that the accompanying drawings are provided in a very simplified form not necessarily presented to scale, and their only intention is to facilitate convenience and clarity in explaining the disclosed embodiments.

Through long-term research and experimentation, the inventors have developed a novel shutter device capable of solving the problems of unstable control of exposure dose accuracy and light leaks arising from the use of existing shutter devices.

Accordingly, the present disclosure provides a shutter device including a movable shading module and a movement control module configured to control movement of the movable shading module. The movable shading module includes a shading unit, a driving unit and a signal measuring unit. The shading unit includes two blades, and the movement control module is configured to generate a control signal. The driving unit is configured to receive the control signal and to drive the two blades. The signal measuring unit is configured to measure an operating status of the blades and feed it back to the movement control module in real time. The movement control module is configured to update the control signal based on the operating status.

Figure 1:
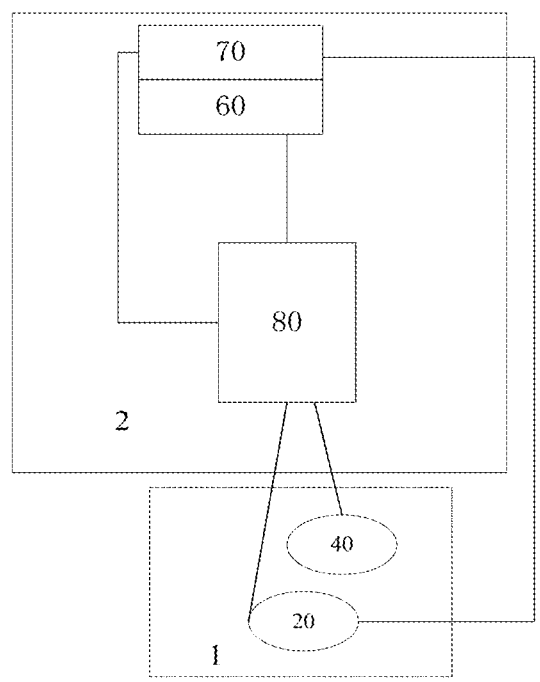
FIG. 1 is an architecture schematic of a shutter device according to an embodiment of the present disclosure.
Figure 2:
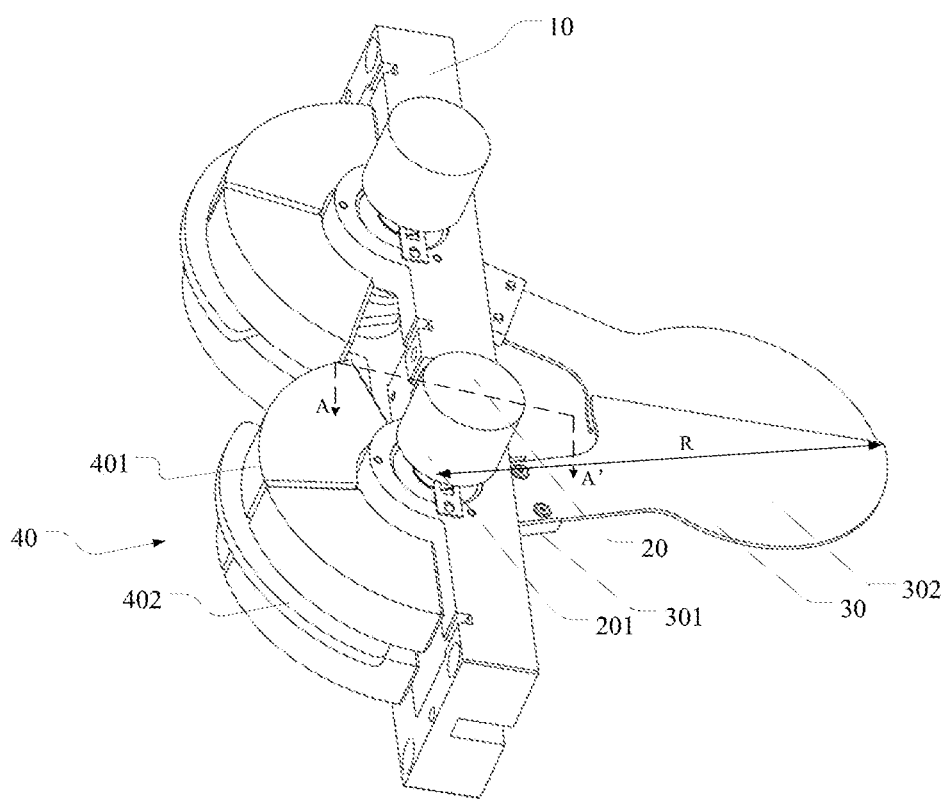
FIG. 2 is a structural schematic of a movable shading module according to an embodiment of the present disclosure.

FIG. 1 is an architecture schematic of a shutter device according to an embodiment of the present disclosure. As shown in FIG. 1, the shutter device includes a movable shading module 1 and a movement control module 2 configured to control movement of the movable shading module 1. FIG. 2 is a structural schematic of the movable shading module 1 according to an embodiment of the present disclosure. As shown, the movable shading module includes a shaft assembly unit 10, a signal measuring unit 20, a shading unit 30 and driving unit 40. In this embodiment, with the signal measuring unit 20, shading unit 30 and driving unit 40 regarded as an assembly, the movable shading module 1 may include two such assemblies which are connected by the shaft assembly units 10 in substantial symmetry to each other. When the shading units 30 in the two assemblies move toward or away from each other, the shutter device will be closed or opened respectively. For the sake of convenience in illustrating, only one of the assemblies will be described below as an example. The shaft assembly unit 10 is coupled to both the driving unit 40 and shading unit 30, while the signal measuring unit 20 is coupled to the shading unit 30. With continued reference to FIG. 1, the movement control module 2 may include a processor 70, a trigger 60 and a controller 80. The processor 70 is configured to communicate with the controller 80 via a communication interface and transmit an exposure command to the trigger 60, while the trigger 60 is configured to trigger the controller 80 based on the exposure command. The controller 80 is configured to control the operating status of the shading unit 30, and the signal measuring unit 20 is configured to feed back the operating status of the shading unit 30 in real time to the processor 70.

The shading unit 30 includes a blade adapter plate 301 and a blade 302 fixed to the blade adapter plate 301 by screws.

Figure 3:
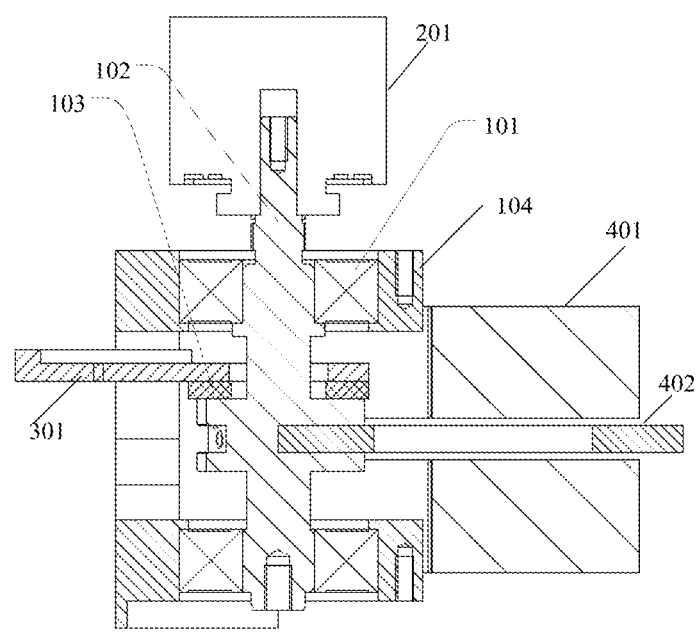
FIG. 3 is a cross-sectional view of a shaft assembly unit according to an embodiment of the present disclosure.

FIG. 3 is a cross-sectional view of the shaft assembly unit according to an embodiment of the present disclosure taken along the broken line A-A' of FIG. 2. As shown in FIG. 3, the shaft assembly unit 10 may include a bearing base 104, a rotating shaft 102, a bearing 101 and a thermal isolation plate 103. The rotating shaft 102 penetrates through the bearing base 104, and the bearing is preferred to be a ceramic bearing. The bearing 101 is secured to the bearing base 104, and the thermal isolation plate 103 is fixed to the rotating shaft 102. The blade adapter plate 301 of the shading unit 30 is connected to the rotating shaft 102, and is located at a side of the shaft assembly unit 10. The driving unit 40 is connected to the rotating shaft 102, and is located at the other side of the shaft assembly unit 10.

With continued reference to FIGS. 2 and 3, the driving unit 40 may include a motor, preferably a voice coil motor including a magnet 401 and a coil 402 attached to the rotating shaft 102 so that the coil 402 is able to drive the rotating shaft 102 to rotate. The bearing 101 has an outer race fixed to the bearing base 104. The blade adapter plate 301 is fixed to the rotating shaft 102, and the blade 302 is fixed to the blade adapter plate 301 by screws so that the blade 302 can be rotated with the rotating shaft 102 driven by the voice coil motor, thereby accomplishing an opening or closing action of the blade 302. The thermal isolation plate 103 is fixed to the rotating shaft 102 in order to block thermal conduction between the blade adapter plate 301 and the blades 302. The thermal isolation plate 103 is preferred to be a glass fiber sheet disposed between the rotating shaft 102 and the blade adapter plate 301 to block heat from the blade adapter plate 301. In this way, heat conducted to the blades 302 can be minimized, resulting in an enhancement in performance of the shutter.

With combined reference to FIGS. 1, 2 and 3, when the coil 402 drives the rotating shaft 102 to rotate, the blades 302 is accordingly driven to rotate due to the connection between the rotating shaft 102 and the blade adapter plate 301, thereby accomplishing an opening or closing action of the blade 302. The signal measuring unit 20 may include a position sensor 201, which is preferred to include a rotary encoder fastened to an end of the rotating shaft 102. The rotary encoder may also be replaced with a circular or linear grating scale. The position sensor 201 can sense in real time a rotation angle and position of the blade 302 and feed the information back to the processor 70. The processor 70 can calculate a difference between the current exposure dose and a theoretical exposure dose according to the dose and control accuracy requirements for exposure. If the difference does not satisfy the expected control accuracy, the shutter will be closed to cease the exposure. Otherwise, the exposure will be continued until a requirement on dose is satisfied. During the continuous exposure process, the rotary encoder 201 always monitors the rotation angle of the blade 302 and feeds the information back to the processor 70 in real time, based on which the processor 70 instructs the controller 80 to control an driving force of the motor to regulate the operation of the blade. In this way, a closed loop control can be achieved to control the exposure dose accuracy and magnitude.

Figure 4:
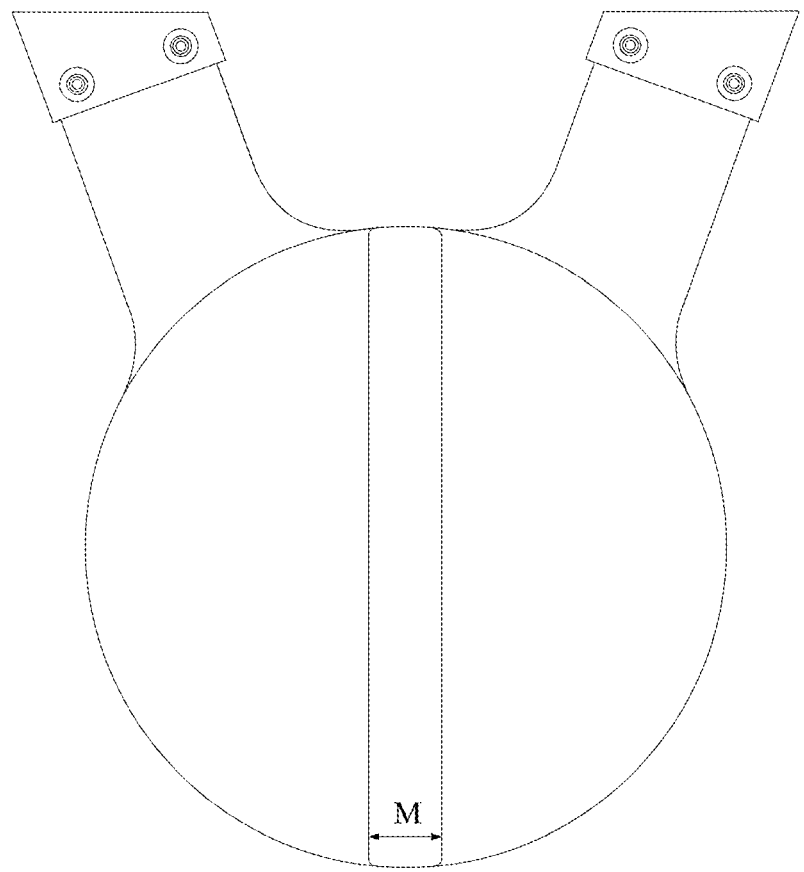
FIG. 4 schematically illustrates closed blades according to an embodiment of the present disclosure.

The two blades are required to be closed after the exposure process (as shown in FIG. 4), with an overlap M between them. In order to eliminate light leaks from the closed blades, a minimum overlap $M_{min}$, shall follow Eqn. 1 as follows, wherein for each of the blades, R represents a radius of rotation, α represents an angle error, and α must satisfy:

$$\alpha \le \arctan\left(\frac{M - M_{min}}{2R}\right) \quad (1)$$

The radius R refers to the distance from a center of rotation of the blade to the most distant point on an outline of its effective shading area. In the embodiment of FIG. 2, the center of rotation is a point at which the corresponding bearing or rotating shaft is centered. The overlap M may be defined as a linear distance between linear edges of the closed blades.

Figure 5:
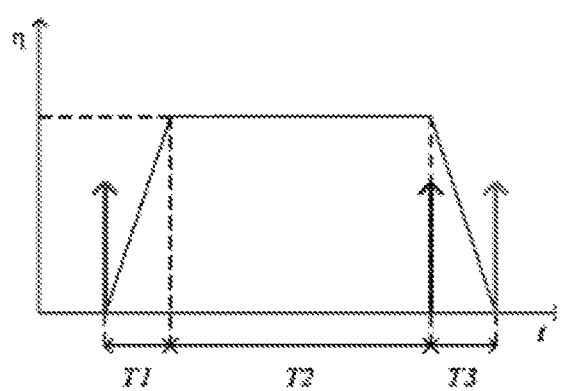
FIG. 5 is a timing diagram of an exposure process according to an embodiment of the present disclosure.

FIG. 5 is a timing diagram of an exposure process according to an embodiment of the present disclosure, in which the ordinate represents the rotation angle (0 at the closed position) and the abscissa represents time. The process can be divided into the following phases: during the time period T1, the blades are increasingly opened until they reach a fully opened state, and exposure process starts and continues; during the time period T2, the blades are kept in the fully opened state, and the exposure process lasts; and during the time period T3, the blades are increasingly closed until they reach a completely closed state, and the exposure process finishes. For a low dose exposure application, the shorter the T1 and T3 periods are, the higher the exposure accuracy will be.

Figure 6:
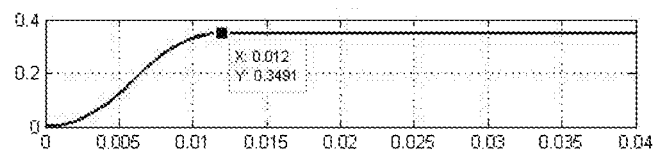
FIG. 6 shows a simulated blade movement profile according to an embodiment of the present disclosure.
Figure 7:
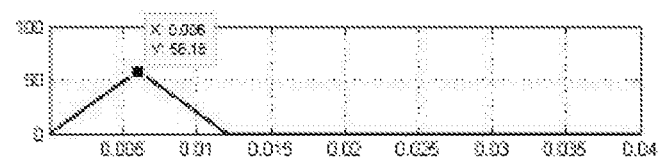
FIG. 7 shows a simulated blade velocity profile according to the embodiment of the present disclosure.
Figure 8:
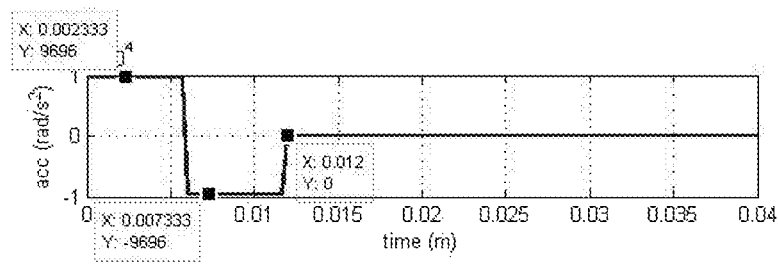
FIG. 8 shows a simulated blade acceleration profile according to the embodiment of the present disclosure.
Figure 9:
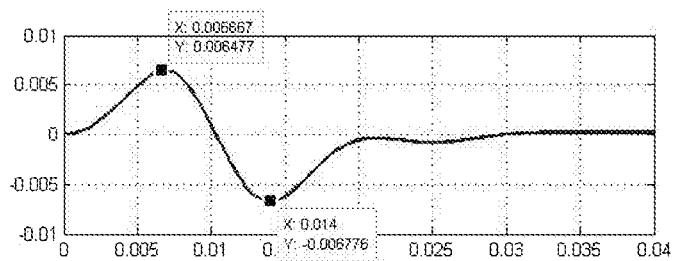
FIG. 9 shows a simulated blade error profile during the movement process according to the embodiment of the present disclosure.

The beneficial effects of the present disclosure will be further explained by way of a specific simulation example, in which the blades are assumed to be opened/closed in 12 ms at a high speed with a rotation angle of 20° (0.349 rad) from the completely closed to opened state. In addition, the blades have a radius of rotation R of 100 mm and an overlap M of 8 mm when they are fully closed. In order to eliminate light leaks during the complete closure thereof, the minimum allowable overlap for them is set to 6 mm FIG. 6 shows a simulated movement profile of the blades, wherein the abscissa represents time (s) and the ordinate represents the angular position (rad) of the blades. As can be seen from FIG. 6, the blades are opened in 12 ms and maintained at a final angle of 0.349 rad. FIG. 7 shows a simulated blade velocity profile, wherein the abscissa represents time (s) and the ordinate represents the angular velocity (rad/s) of the blades. As can be seen from FIG. 7, the blades are accelerated in the first 6 ms to a maximum angular velocity of 58.18 rad/s and then decelerated in the following 6 ms (i.e., from 6 ms to 12 ms) until they completely stops moving. FIG. 8 shows a simulated blade acceleration profile, wherein the abscissa represents time (s) and the ordinate represents the acceleration (rad/s$^2$) of the blades. The blades are accelerated at 9696 rad/s$^2$ in the first 6 ms and then at −9696 rad/s$^2$ in the following 6 ms. FIG. 9 shows a simulated error profile of the blades during the above movement process, wherein the abscissa represents time (s) and the ordinate represents the angular error (rad), i.e., a deviation between a target angle of the blades prescribed by the movement control module 2 and the actual angle of the blades. As can be seen from FIG. 9, the maximum error is 6.776 mrad during the process, and a maximum allowable angular error for ensuring absence of light leaks from the shutter can be calculated as 10 mrad according to Eqn. 1. Therefore, the shutter device of the present disclosure can eliminate light leaks at a high closing/opening speed with high exposure accuracy satisfying the needs of low-dose exposure applications.

Accordingly, the present disclosure also provides a closed loop control method using the shutter device as defined above. The method may include the steps of:

step 1, generating a control signal by the movement control module;

step 2, driving the shading unit to move by the driving unit;

step 3, measuring an operating status of the shading unit and feeding it back to the movement control module in real time, by the signal measuring unit;

step 4, transmitting, according to the requirement on dose and the results measured by the signal measuring unit, a control signal to the driving unit by the movement control module; and step 5, adjusting, by the driving unit, the operating status of the shading unit through changing the driving force of the driving unit according to the control signal from the movement control module.

This closed loop control method will be described in greater detail by way of continuing the above example.

Upon receiving an exposure command from the processor 70, the trigger 60 transmits a command for opening the blades 302 to the controller 80, and the controller 80 accordingly transmits a command to the motor, causing the motor to operate to drive the rotating shafts 102 to open the blades 302. The position sensor 201 senses an operating status of the blades 302 and feeds it back to the processor 70. Based on the feedback, the processor 70 adjusts the exposure command through the trigger 60, and the controller 80 adjusts a driving command according to the exposure command to adjust the operating status of the blades 302 in real time. After the exposure is completed, the blades 302 are closed, and an opening/closing sensor notifies the processor

70 that the blades are in a closed status. The processor 70 then waits for a new exposure process according to a preset schedule.

The method will be described in yet greater detail with the above components implemented as particular products. In particular, the processor 70 may be implemented as a PPC board, the trigger 60 as an ISB board and the controller 80 as, for example, a commercial controller. The ISB board is designed to trigger the commercial controller which is, in turn, adapted to enable closed loop position control by the drive motors and the position sensor 201. The PPC board may communicate with the commercial controller via an RS232 interface equipped with multiple serial ports. The control may involve the following two major processes:

(1) dose-based control by the PPC board and ISB board— a) the PPC board transmits an exposure command to the ISB board; b) the ISB board transmits a Trig_open command (for opening the blade) to the commercial controller according to a drive command; and c) after the shutter holding times for different doses are calculated, the ISB board transmits a Trig_close command (for closing the blade) to the commercial controller; and (2) control by the commercial controller based on the commands from the ISB board—a) after powered up, the commercial controller performs a search-for-zero action, and stays in a shutdown state at a low electric current; and b) a server waits for a Trig command from the ISB board to close or open the blades.

In order to demonstrate the reliability of the close-loop controlled shutter, an exemplary example is designed with a blade opening/closing time of 12 ms (i.e., a high blade opening/closing speed), a blade sweep angle of 20°, a blade radius R of rotation of 100 mm, an inter-blade overlap M of 8 mm during closure, a minimum allowable blade overlap of 6 mm for avoiding light leaks from the closed blades, and a servo period of 333 μs. FIG. 6 shows a simulated blade movement profile, wherein the abscissa represents time (s) and the ordinate represents the angular position (rad) of the blades. As can be seen from FIG. 6, the blades are opened in 12 ms and maintained at a maximum angle of 0.349 rad. FIG. 7 shows a simulated blade velocity profile, wherein the abscissa represents time (s) and the ordinate represents the angular velocity (rad/s) of the blades. As can be seen from FIG. 7, the blades are accelerated in the first 6 ms to a maximum angular velocity of 58.18 rad/s and then decelerated in the following 6 ms (i.e., from 6 ms to 12 ms) until they completely stops moving. FIG. 8 shows a simulated blade acceleration profile, wherein the abscissa represents time (s) and the ordinate represents the acceleration (rad/s$^2$) of the blades. The blades are accelerated at 9696 rad/s$^2$ in the first 6 ms and then at −9696 rad/s$^2$ in the following 6 ms. FIG. 9 shows a simulated error profile of the blades during the above movement process, wherein the abscissa represents time (s) and the ordinate represents the angular error (rad). As can be seen from FIG. 9, the maximum error is 6.776 mrad during the process, and a maximum allowable angular error for ensuring absence of light leaks from the shutter can be calculated as 10 mrad according to Eqn. 1. Therefore, the shutter device of the present disclosure can eliminate light leaks at a high closing/opening speed with high exposure accuracy satisfying the needs of low-dose exposure applications.

The present disclosure provides a shutter device and a method. The shutter device comprises a movable shading module and a movement control module configured to control the movement of the movable shading module. The movable shading module comprises a shading unit, a driving unit and a signal measuring unit. The movement control module is configured to generate a control signal. The driving unit is configured to receive the control signal and control the operation of the shading unit, and the signal measuring unit is configured to measure an operating status of the shading unit and feed it back to the movement control module in real time. The movement control module is configured to transmit a real-time control signal based on the fed back operating status. This device can overcome the problems of low exposure dose accuracy and light leaks arising from the use of existing shutters and provide various accurately-controlled exposure doses suitable for different applications.

Further, the controller controls the motor so that the operating status of the blades can also be controlled, the rotary encoder feeds back the operating status of the blades to the controller in real time, the controller then adjusts the driving force of the motor, thereby forming a closed loop control, which effectively eliminates light leaks during closure of the shutter.

The foregoing description presents merely a few preferred embodiments of the present disclosure and is not intended to limit the scope thereof. Any obvious change or modification, such as replacing the motors with electric or pneumatic cylinder, is intended to fall within the scope of the disclosure.

What is claimed is:

1. A shutter device, comprising a movable shading module and a movement control module; wherein the movement control module is configured to control a movement of the movable shading module, the movable shading module comprises a shading unit, two driving units and two signal measuring units, the shading unit comprises two blades, the movement control module is configured to generate a control signal, the two driving units are configured to receive the control signal and drive the two blades, the two signal measuring units are configured to measure an operating status of the two blades and feed the operating status back to the movement control module in real time, the movement control module is configured to update the control signal based on the fed back operating status;

wherein the two driving units and the two signal measuring units respectively corresponding to the two blades;

the movable shading module further comprises two shaft assembly units each comprising a bearing base, a rotating shaft and a bearing, the bearing disposed within the bearing base, the rotating shaft penetrating through the bearing, a corresponding one of the two blades being connected to the rotating shaft and located on a side of the rotating shaft, a corresponding one of the two driving units being connected to the rotating shaft and located on the other side of the rotating shaft.

2. The shutter device according to claim 1, wherein each of the driving units comprises a motor configured to drive a corresponding one of the two blades to move, so as to allow opening and closing of the two blades.

3. The shutter device according to claim 1, wherein the shading unit further comprises two blade adapter plates, a corresponding one of the two blades being connected to the rotating shaft by a corresponding one of the two blade adapter plates.

4. The shutter device according to claim 3, wherein a thermal isolation plate is arranged between a corresponding one of the two blade adapter plates and the rotating shaft.

5. The shutter device according to claim 1, wherein the movement control module is configured to control a rotation angle error α of each of the two blades so as to ensure absence of light leaks when the two blades are closed together, according to:

$$\alpha \leq \arctan\left(\frac{M - M_{min}}{2R}\right)$$

where M represents an overlap between the two blades; $M_{min}$ represents a minimum allowable overlap for the two blades; and R represents a radius of rotation of each of the two blades.

6. The shutter device according to claim 1, wherein each of the signal measuring units comprises a position sensor configured to sense a position of a corresponding one of the two blades in real time.

7. The shutter device according to claim 6, wherein the position sensor comprises a rotary encoder or a circular grating scale which is fastened at an end of the rotating shaft and configured to detect a rotation angle of the corresponding one of the two blades in real time.

8. The shutter device according to claim 6, wherein the position sensor comprises a linear grating scale.

9. The shutter device according to claim 1, wherein the movement control module comprises a processor, a trigger and a controller; wherein the processor is configured to transmit an exposure command to the trigger, the trigger is configured to trigger the controller according to the exposure command, the processor is configured to communicate with the controller through a communication interface, and the controller is configured to control the movement of the movable shading module based on information communicated from the processor.

* * * * *